United States Patent [19]
Britton et al.

[11] Patent Number: 4,794,325
[45] Date of Patent: Dec. 27, 1988

[54] CALIBRATED POWER DETECTOR

[75] Inventors: Ralph H. Britton, Palo Alto; Bret A. Herscher, Mountain View, both of Calif.

[73] Assignee: Wavetek Corporation, San Diego, Calif.

[21] Appl. No.: 738,964

[22] Filed: May 29, 1985

[51] Int. Cl.$^4$ ............... G01R 17/06; G01R 11/32; G01C 17/38
[52] U.S. Cl. .................. 324/99 D; 324/74; 73/1 R
[58] Field of Search ........... 324/99 D, 95, 74, 130; 73/1-6; 364/571, 573; 374/132

[56] References Cited

U.S. PATENT DOCUMENTS

| | | | |
|---|---|---|---|
| 3,653,037 | 3/1972 | Utley | 324/74 X |
| 4,063,447 | 12/1977 | Mathison | 364/571 |
| 4,546,313 | 10/1985 | Moyer | 324/95 |
| 4,692,696 | 9/1987 | Bray | 324/74 X |
| 4,700,128 | 10/1987 | Levonius, Jr. | 324/74 X |

Primary Examiner—Reinhard J. Eisenzopf
Assistant Examiner—Vinh P. Nguyen
Attorney, Agent, or Firm—Ellsworth R. Roston; Charles H. Schwartz

[57] ABSTRACT

Power from an alternating signal having a frequency variable in a wide and relatively high range such as approximately 10 megahertz to 40 gigahertz is indicated by a detector. To calibrate the detector, an alternating signal is introduced from a source to a bridge including a regulating member such as a thermistor. The bridge also receives a direct voltage. The thermistor is maintained at a particular impedance such as 400 ohms, regardless of the power provided by the alternating signal, by varying the magnitude of the direct voltage. The alternating signal, which is regulated in accordance with the dc voltage, is also introduced to the detector. The detector output is introduced to a data processing unit which processes the detector output to indicate the power from the alternating signal. The output from the data processing unit is converted to an analog signal which is combined with the signal from the bridge to produce a resultant signal. The amplitude of the resultant signal is compared with a reference signal to produce an error signal which is introduced to the source of the alternating signal to obtain adjustments in the output from the source in a direction to minimize the error. In this way, the data processing unit provides an output alternating signal of regulated and variable amplitude. The output from the detector is also used to calibrate the alternating signal from the source when different attenuators are introduced into the system to provide different ranges of attenuation.

23 Claims, 3 Drawing Sheets

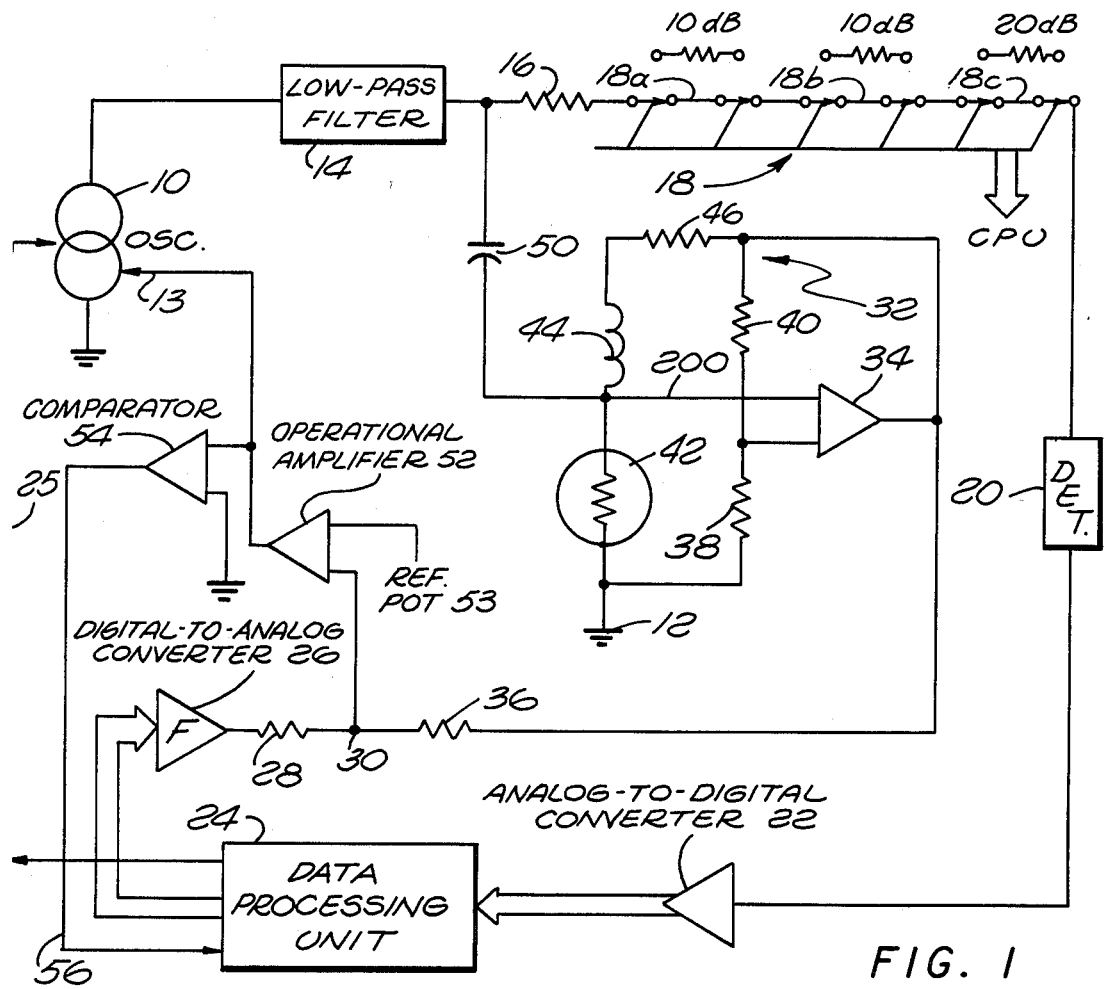
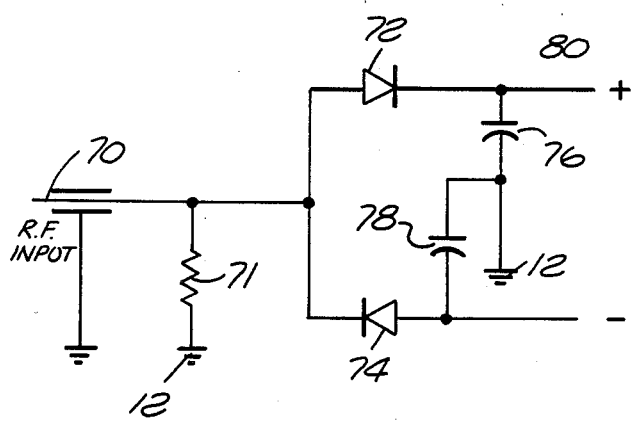
FIG. 2
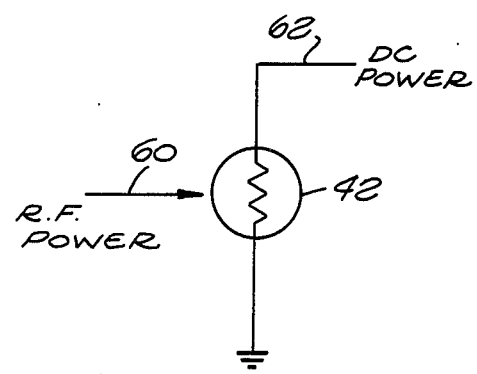
FIG. 3

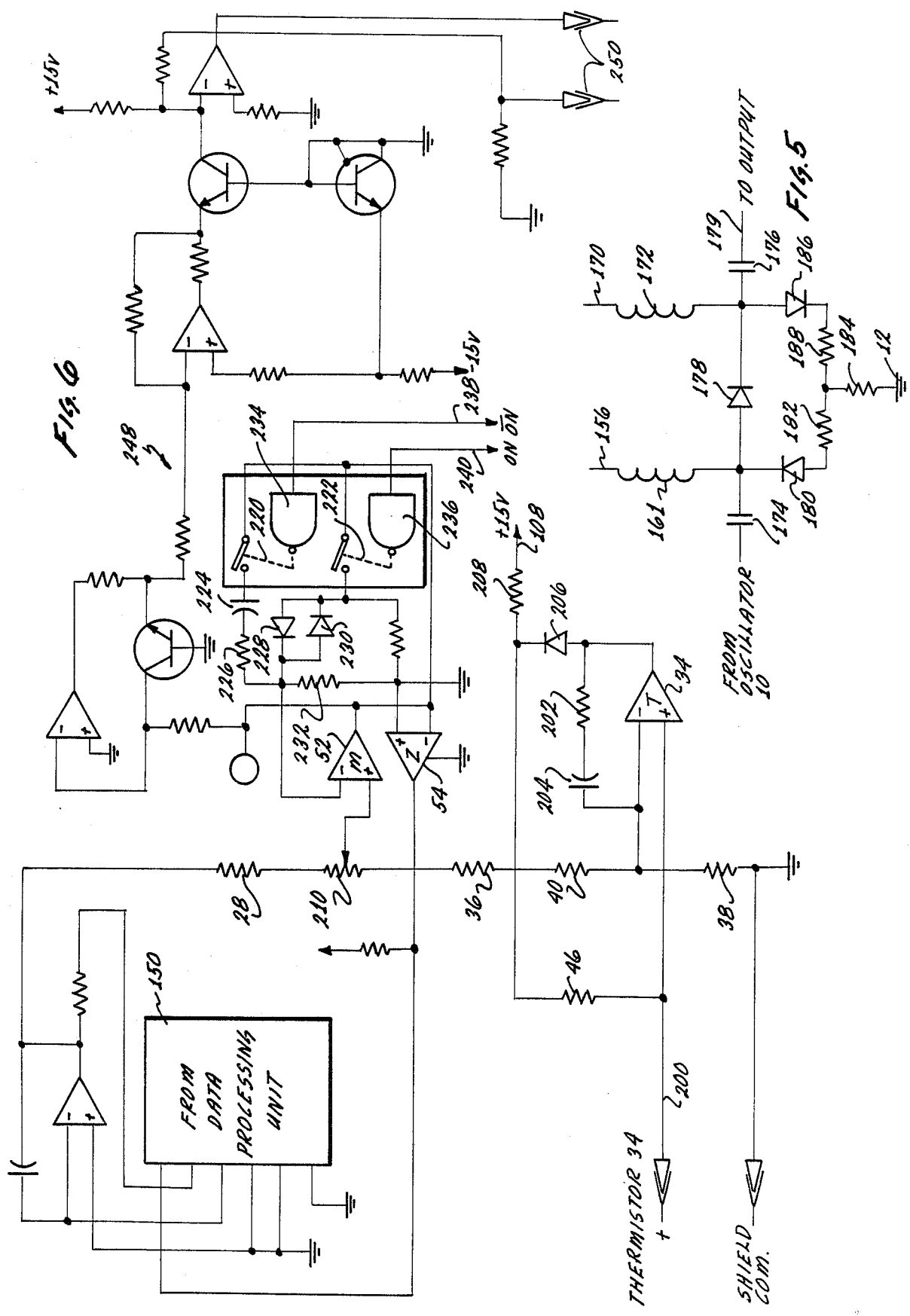

CALIBRATED POWER DETECTOR

This invention relates to apparatus for detecting the power provided by an externally applied alternating signal and more particularly relates to apparatus for detecting the amplitude of an alternating signal having a considerable range of frequencies. The apparatus of this invention is particularly adapted to indicate, with considerably more precision than the apparatus available in the prior art, the power provided by an alternating signal.

It is often important to indicate the power provided an alternating signal which has a variable frequency. For example, it is desirable to indicate the power provided by an alternating signal which is used to transmit information or detect distant objects as in radio or radar applications. Such an indication of the power provided by an alternating signal is helpful in insuring that the proper operation of the source of the alternating signal generator is being obtained at each instant.

Considerable progress has been made in recent years in providing apparatus for indicating the power provided by an alternating signal. However, in spite of such considerable progress, considerable errors are still inherent in the operation of equipment for indicating the power provided by an alternating signal. For example, errors approaching three or four percent (3-4%) are often produced in indicating the power provided by an alternating signal even though it is often desired to indicate such power with errors considerably less than one percent (1%). A considerable effort has been made in recent years to reduce the errors in indicating the power provided by an alternating signal. In spite of such efforts, the apparatus now in use still provides errors in excess of those which are often considered acceptable.

Apparatus using a thermal sensing device can be constructed to provide great precision but is operative over a limited range of amplitude of power and is slow. Other apparatus, such as a diode detector, can be made to operate over a relatively wide range of power and to indicate instantaneously the power provided by the alternating signal. However, such apparatus provides relatively great errors in measurement. This invention makes use of the precision of thermal techniques and, by a novel calibration system, transfers the accuracy of such thermal techniques to a diode detector over a wide range of power.

In one embodiment of the invention, apparatus is provided for indicating the power provided by an alternating signal having a frequency variable in a wide and relatively high range such as approximately ten (10) megahertz to forty (40) gigahertz. A calibrating alternating signal is introduced to a bridge which includes a regulating member such as a thermistor. The bridge also receives a direct voltage. The direct voltage supplied to the bridge operates to produce a particular impedance, such as an impedance of four hundred (400) ohms, in the thermistor regardless of the amplitude of the alternating voltage. Furthermore, the bridge dc voltage is used to regulate the amplitude of the source of the alternating signal to maintain the dc voltage at a predetermined value. In this way, the alternating signal can be controlled by setting the dc voltage to any value over a range of values.

The alternating voltage is also introduced to a detector during the calibration operation. The output of the detector is converted to a digital voltage and this digital voltage is introduced to a data processing unit. The data processing unit processes the signal from the detector to develop a look-up table to calibrate the output from the detector in accordance with the precisely known output from the alternating signal source.

A signal from the data processing unit is converted to an analog signal and this signal is combined with the signal from the bridge to produce a resultant signal. The amplitude of the resultant signal is compared with a reference alternating signal to produce an error signal and any such error signal is introduced to the source of the alternating signal to control the amplitude of the signal from the source to obtain adjustments in the output from the source unit in a direction to minimize the error signal. In this way, the data processing equipment provides control over the amplitude of the alternating signal.

The apparatus of this invention has certain important advantages. One advantage is that the apparatus of this invention provides indications of power from an alternating signal with errors less than one percent (1%) in comparison to errors of three percent (3%) to four percent (4%) in comparable apparatus of the prior art. Another advantage is that the apparatus of this invention provides accurate indications of power with such accuracies through a range of attenuations at least as high as fifty decibels (50 db). The apparatus of this invention is able to operate automatically to provide such indications of power with such accuracies through such wiee ranges of attenuation.

In the drawings:

FIG. 1 is a block diagram of one embodiment of a system constituting this invention for indicating the power provided by an alternating signal;

FIG. 2 is a schematic circuit diagram of a detector included in the block diagram of FIG. 1;

FIG. 3 is a simplified diagram of circuitry in the system of FIG. 1 for regulating the impedance of a member, such as a thermistor, which is included in the block diagram of FIG. 1;

FIG. 5 is a circuit diagram showing in some detail other stages included in block form shown in FIG. 1; and FIG. 6 is a diagram of circuitry for introducing alternating signals from the circuitry of FIG. 5 to an attenuator shown in FIG. 1.

Figure 4:
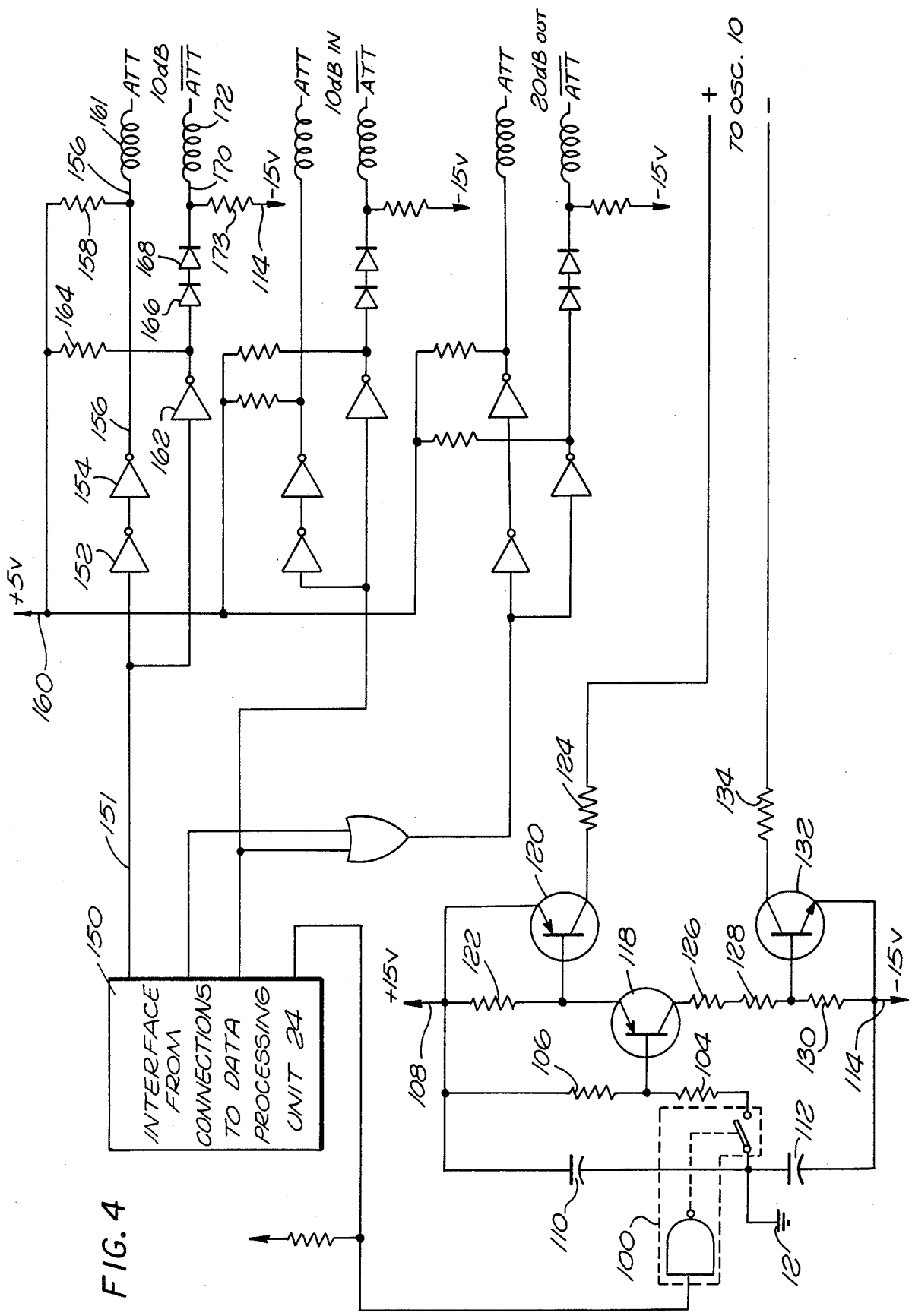
FIG. 4 is a circuit diagram showing in some detail certain of the stages included in block form in FIG. 1.

In the embodiment shown in FIG. 1, an oscillator 10 provides alternating signals having a fixed frequency at a suitable value. This frequency may be in the range of approximately ten megahertz (10 mhz) to forty gigahertz (40 ghz). One terminal of the oscillator 10 may be connected to a reference potential such as ground 12 and the other terminal of the oscillator is connected to a low-pass filter 14 which is constructed to pass signals at the fundamental frequency from the oscillator 10 but to prevent the passage of any harmonics of the fundamental frequency. The signals from the filter 14 are introduced to an impedance 16 which may have a suitable value such as approximately 50 ohms.

A plurality of attenuators generally indicated at 18 are connected to the impedance 16. The attenuators 18 may include individual attenuators such as attenuators 18a, 18b, 18c, etc. Each of the attenuators 18a, 18b, 18c, etc. is constructed to provide an individual value of attenuation. For example, the attenuator 18a may be constructed to provide an attenuation in the range to 10 db; the combination of the attenuators 18a and 18b may be constructed to provide an attenuation in the range to 20 db; and the combination of the attenuators 18a, 18b and 18c may be constructed to provide an attenuation in the range to 40 db in 10 db steps. The attenuators 18a, 18b, 18c etc. may be controlled by switches in a conventional manner to provide a series relationship between the different attenuators so as to control the range of attenuation which is provided.

It will be appreciated that other arrangements of attenuators may be provided than that shown in FIG. 1 and described in the previous paragraph. For example, the attenuator 18a may have a range of 20 db; the attenuator 18b may have a range of 20 db; and the attenuator 18c may have a range of 10 db. By connecting various combinations of the attenuators 18a, 18b and 18c in the system, any attenuation in the range of 0 db to 40 db or more may be provided.

For the purpose of calibrating a detector 20, the signals passing through the attenuators 18 are introduced to the detector 20. The signals passing through the detector 20 are introduced to an analog-to-digital converter 22 which may be constructed in a conventional manner. The digital output from the converter 22 in turn passes to a data processing unit 24 for processing, in the data processing unit, of the signals from the detector 20. A signal may be introduced on a line 25 from the data processing unit 24 to the oscillator 10 to control the times during which the oscillator is operative to produce the oscillatory signals.

The digital signals from the data processing unit 24 are converted to an analog form by a converter 26 and the analog signals are passed through an impedance 28 to a terminal 30. A voltage is also introduced to the terminal 30 from a bridge generally indicated at 32. The bridge 32 includes an operational amplifier 34 having its output connected through an impedance 36 to the terminal 30.

The operational amplifier 34 also has a pair of input terminals one of which is connected to a first terminal of an impedance 38, the second terminal of the impedance being connected to the reference potential such as the ground. An impedance 40 is disposed electrically between the first input terminal of the operational amplifier 34 and the output terminal of the amplifier. Although the output of the amplifier 34 is shown in FIG. 1 as being connected directly to the impedance 40, it will be appreciated that the connection between the amplifier 34 and the impedance 40 may be made through other impedances as shown in FIG. 4 and as described subsequently.

The second input terminal of the operational amplifier 34 is electrically common with one terminal of a regulating member such as a thermistor 42, the second terminal of which receives the reference potential such as the ground 12. The second input terminal of the operational amplifier 34 is also common with an inductance 44 which is in series with an impedance 46 connected to the output terminal of the operational amplifier 34. The impedances 38, 40 and 46 may constitute resistances having a suitable value such as 400 ohms. The second input terminal of the operational amplifier is also connected to one terminal of a capacitance 50, the other terminal of which is common with the output of the low-pass filter 14.

The voltage on the terminal 30 is introduced to one terminal of an operational amplifier 52 having a second terminal connected to a reference potential. The output from the amplifier 52 is introduced to a first terminal of a comparator 54 having a second terminal connected to the reference potential such a the ground 12. The output terminal of the amplifier 52 is also connected to control the voltage from the oscillator 13. The output from the comparator 54 is introduced to the data processing unit 24 through a line 56.

The signals from the oscillator 10 pass to the low-pass filter 14. The low-pass filter 14 operates to pass only the components constituting the fundamental frequency of the signals from the oscillator 10 and to prevent any harmonics from passing through the filter. The signals from the filter 14 are then introduced to the bridge 32.

As will be seen, the bridge 32 has four impedances, three of which have values of 400 ohms and the fourth of which constitutes the thermistor 42. The impedance of the thermistor 42 is dependent upon the temperature of the thermistor and may vary between a relatively high value such as approximately 15,000 ohms at room or ambient temperature and a value of approximately 400 ohms when heated. As will be appreciated, the thermistor is maintained at an impedance of 400 ohms when heated since the thermistor is one leg of the bridge 32 and all of the other legs of the bridge have impedances of 400 ohms. When the thermistor has an impedance of 400 ohms, the bridge 32 is balanced and substantially equal voltages are introduced to the two input terminals of the amplifier 34.

The signals produced by the bridge 32 are introduced through the amplifier 34 and the resistance 36 to the terminal 30. The terminal 30 also receives the signals produced by the digital-to-analog converter 26. The converter 26 operates to convert to an analog form the signals produced by the detector 20 and processed by the data processing unit 24. The signals produced by the detector 20 are responsive to the signals passing to the detector 20 through the attenuator from the filter 14.

The signal on the terminal 30 is a resultant signal which is a combination of the direct voltage passing through the converter 26 and the alternating voltage passing from the filter through the bridge 32. The resultant signal on the terminal 30 is introduced to the operational amplifier 52 which compares the resultant signal with a reference signal or reference potential from a reference potentiometer 53 and generates an error signal. This error signal is introduced as a negative feedback signal to the oscillator 10. The error signal is operative to change the alternating voltage passing from the source 10 through the filter 14 to the bridge 32. This negative feedback causes the system to settle to a point where the voltage on the terminal 30 becomes zero.

At times, it may be necessary to measure the direct voltage applied to the bridge 32 when no alternating voltage is provided by the source 10. For this purpose, the output of the operational amplifier 52 is also introduced into a comparator 54. This produces an error signal which is introduced into the data processing unit 24 to indicate whether the voltage at the terminal 30 is greater or less than zero. The data processing unit 24 is then able to output a series of trial voltages from the converter 26 until the voltage output from the converter 26 is equal to the voltage at the bridge 32. The data processing unit 24 performs this calculation without any power from the oscillator 10. When the combination of the voltage output from the converter 26 and the voltage at the bridge 12 becomes equal to the reference potential 53, no error signal is produced by the operational amplifier 52.

FIG. 3 illustrates on a schematic basis the operation of the thermistor 42. As will be seen in FIG. 1, RF power is introduced to the thermistor 42 through the low-pass filter 14 and the capacitor 50 in FIG. 1. This introduction of RF power to the thermistor 42 is illustrated schematically at 60 in FIG. 3. Power from a direct current is also shown in FIG. 3 as being introduced to the thermistor 42 through a line 62. The sum of the RF and the dc occurs when the RF signal power will be just sufficient to maintain the thermistor at the reference impedance value, for example 400 ohms.

As will be seen, the system shown in FIG. 1 operates with different attenuators connected in the system. For example, the attenuator 18a may be connected at one time in the system to obtain an output indication in a range of 0 db to 10 db. At another time, the attenuators 18a and 18b may be connected in the system to provide an output indication in a range of 0 db to 20 db.

When only the attenuator 18a is connected in the system, the maximum attenuation is approximately 10 db. When the attenuators 18a and 18b are connected in the system and the attenuator 18a is at the maximum position of attenuation and the attenuator 18b is at a minimum position of attenuation, the attenuation should still be 10 db. This means that the voltage produced by the detector 20 under such circumstances should be the same under each of the operating conditions specified in this paragraph.

It may occur that the output from the detector 20 is different at the maximum range of the attenuator 18a (with only the attenuator 18a connected in the system) than at the minimum range of the attenuator 18b (with both the attenuators 18a and 18b connected in the system). Under such circumstances, the data processing unit 24 provides an adjustment in the output passing from the data processing unit 24 through the converter 26 to the terminal 30. This adjustment is automatically done whenever a detector 20 is being calibrated.

FIG. 2 illustrates one embodiment of the detector 20 in some detail. The embodiment of the detector 20 shown in FIG. 2 include a coaxial input line 70 having its housing connected to a reference potential such as ground. A connection is also made from the coaxial line 70 to one terminal of an impedance 71 having a suitable potential such as appoximately fifty (50) ohms. The second terminal of the impedance 71 is common with the reference potential such as the ground 12. The coaxial line 70 is also connected to the anode of a diode 72 and the cathode of a diode 74. The cathode of the diode 72 and the anode of the diode 74 are in series with a pair of capacitances 76 and 78, the common terminals of which are connected to the reference potential such as the ground 12.

The coaxial transmission line 70 is terminated in its characteristic impedance by hhe resistor 71, so the length of the transmission line is not significant. The radio frequency signals from the oscillator 10 pass through the coaxial line to the diodes 72 and 74. In the positive half-cycles, the signals pass through the diode 72 and charge the capacitor 76 to a positive value. In the negative half-cycles, the signals pass through the diode 74 and charge the capacitance 78. Thus, a positive voltage is produced on a line 80 and a negative voltage is produced on a line 82. As a result, the circuitry shown in FIG. 2 operates as a full wave rectifier.

FIG. 4 illustrates in some detail certiin of the stages shown in block diagram in FIG. 1. In FIG. 4, stages are provided for controlling the operation of the oscillator 10 in FIG. 1. These stages include a field effect transistor switch 100. The field effect transistor switch 100 is shown within broken lines in FIG. 4. One terminal of the switch 100 is common with the reference potential such as the ground 12 and the other terminal of the switch is in series with a pair of resistors 104 and 106 and with a positive supply 108 constructed to provide a suitable voltage such as +15 volts. The resistors 104 and 106 may respectively have suitable values such as 22 kilo-ohms and 4.7 kilo-ohms. A capacitor 110 having a suitable value such as 0.1 microfarads is connected between the voltage source 108 and the reference potential such as the ground 12. Opposite terminals of a capacitor 112 having a suitable value such as 0.1 microfarads are common with the reference potential such as the ground 12 and a voltage source 114 constructed to provide a suitable negative potential such as approximately 15 volts.

The base of a transistor 118 is connected to the terminal common to the resistors 104 and 106. The transistor 118 may be a PNP type of transistor. The emitter of the transistor 118 is common with the base of a transistor 120 which may also be a PNP type of transistor. The emitter of the transistor 118 is also connected to one terminal of a resistance 122 having a suitable value such as approximately 1 kilo-ohm. Connections are made from the second terminal of the resistance 122 and the emitter of the transistor 120 to the voltage supply 108. A resistance 124 having a suitable value such as approximately one hundred (100) ohms is disposed electrically between the collector of the transistor 120 and one terminal of the oscillator 10.

Resistances 126, 128 and 130 are in series between the collector of the transistor 118 and the source 114 of negative voltage. Each of the resistances 126, 128 and 130 may have a suitable value such as approximtely one (1) kilo-ohm. The base of a transistor 132 is common to terminals in the resistances 128 and 130. The emitter of the transistor 132 receives the voltage from the power supply 114. The collector of the transistor 132 is connected to a second terminal of the oscillator 10 through a resistance 134 having a suitable value such as approximately one hundred (100) ohms. The transistor 132 may be an NPN type.

When the transistor 120 is not conductive, the transistor 118 is not conductive because the emitter and the base of the transistor 118 are at approximately the same voltage. Since the transistor 118 is not conductive, the emitter and the base of the transistor 120 are at the same potential and the emitter and the base of the transistor 132 are at the same potential. As a result, the transistor 120 remains non-conductive and the transistor 132 is also not conductive.

The field effect transistor switch transistor 100 is energized when it is desired that the oscillator 10 produce signals. When the switch 100 is energized, current flows through a circuit including the source 108, the resistors 106 and 104 and the switch 100. This causes a bias to be applied to the base of the transistor 118 through the resistors 104 and 106 relative to the bias on the emitter of the transistor so as to make the transistor 118 conductive.

When the transistor 118 becomes conductive, current flows through a circuit including the voltage source 108, the resistance 122, the transistor 118, the resistances 126, 128 and 130 and the voltage source 114. This current produces a negative voltage on the base of the transistor 120 relative to the voltage on the emitter of the transistor so that the transistor becomes conductive. Similarly, a voltage is produced on the base of the transistor 132 relative to the voltage on the emitter of the transistor so that the transistor 132 becomes conductive. When the transistors 120 and 132 become conductive, a positive voltage is produced on the collector of the transistor 120 relative to the voltage produced on the collector of the transistor 132. These voltages cause the oscillator 10 to become energized.

FIG. 4 also illustrates circuitry for connection to the different attenuators shown in FIG. 1. Such circuitry includes an interface 150 from the data processing unit 24 in FIG. 1 for controlling the activation of the different attenuators. A line 151 passes from this interface to a pair of amplifier-inverters 152 and 154 in series. The output from the amplifier-inverter 154 is introduced to a line 156. A resistance 158 having a suitable value such as approximately 1.21 kilo-ohms is connected between the line 156 and a voltage source 160 constructed to provide a suitable potential such as approximately +5 volts. An inductance 161 is in series with the line 156.

The line 151 from the interface 150 is also introduced to an amplifier-inverter 162. The output of the amplifier-inverter 162 is connected to a pair of diodes 166 and 168 disposed electrically in a series relationship. The anode of the diode 166 is common with the output of the amplifier-inverter 162 and the cathode of the diode 166 is common with the anode of the diode 168. The cathode of the diode 168 is connected to a line 170. An inductance 172 is in series with the line 170. A resistance 173 is connected between the inductance 172 and voltage supply 114 providing a suitable negative voltage such as −15V.

The inductances 161 and 172 shown in FIG. 4 are also included in the circuitry of FIG. 5. The terminal of the inductance 161 opposite the line 156 receives the alternating signals through a capacitor 174 from the oscillator 10. The anode of a diode 178 is common with the capacitance 174 and the inductance 161, and the cathode of the diode 178 is common with the inductance 172 and one terminal of a capacitance 176. The other terminal of the capacitance 176 is common with an output line 179.

The cathode of a diode 180 is connected to the anode of the diode 178. A pair of resistances 182 and 184 are in series between the anode of the diode 180 and the reference potential such as the ground 12. A connection is made from the cathode of the diode 178 to the anode of a diode 186. A series relationship is provided by a resistance 188 and the resistance 184 between the cathode of the diode 186 and the reference poteniial such as the ground 12.

When the data processing unit 24 in FIG. 1 passes a positive signal to the line 151, the output of the amplifier-inverter 162 is negative and the output of the amplifier inverter 154 is positive. Current then flows through the inductance 161 in FIG. 4 and through the PIN diode 178 in FIG. 5 and back to the negative voltage supply 114 through the inductance 172 and the resistance 173. The PIN diode 178 is then conductive and permits the R.F. signal to pass unattenuated from the oscillator 10 through the capacitance 174, the diode 178 and the capacitor 176 to the output line 179. When the signal on the line 151 is negative, the output from the amplifier-inverter 162 is positive so that current flows through the inductor 172 ((FIGS. 4 and 5), the diode 186 (FIG. 5), the resistances 188 and 182, the PIN diode 180, and the inductance 161 to the amplifier-inverter 154. Now the PIN diodes 186 and 180 are conductive and PIN diode 178 is non-conductive so that the RF signal from the oscillator 10 flows through the capacitor 174, the PIN diode 180, RF the resistances 182 and 188, the PIN diode 186 and the capacitance 176 to the output line 179. The diodes 166 and 168 are included primarily to produce a voltage drop and to isolate the amplifier inverter 162.

The circuitry shown in FIG. 5 and described above is provided for the attenuator 18a in FIG. 1. Similar circuitry is also provided for the attenuator 18b (FIG. 1), which provides an attenuation in the range of 0 db to 20 db. Similar circuitry is also provided for the attenuator 18c, which provides an attenuation in the range of 0 db to 20 db. As will be appreciated, the attenuators 18a, 18b and 18c can be connected in the system shown in FIG. 1 in various combinations to provide an attenuation between 0 db and 50 db.

FIG. 6 illustrates in additional detail the construction of certain of the stages shown in FIG. 1. The circuitry shown in FIG. 6 includes the operational amplifier 34 and the connection from the thermistor 42 to one of the input terminals in the amplifier through a line 200. The output of the amplifier 34 is introduced to the other input terminal of the amplifier through a resistance 202 and a capacitance 204 in series. The resistance 202 may have a suitable value such as approximately 22 kilo-ohms and the capacitance 204 may have a suitable value such as approximately 0.1 microfarads. The output terminal of the amplifier 34 is also connected to the anode of a diode 206, the cathode of which receives voltage from the power supply 108 through a resistance 208 having a suitable value such as approximately 1 kilo-ohm.

The resistance 202 and the capacitance 204 prevent the amplifier 34 from oscillating as a result of time lags in the operation of the thermistor. The diode 206 and the resistor 208 ensure that the bridge circuit comprising the resistors 38, 40 and 46 and the thermistor 42 in FIG. 1 are maintained at a positive potential with respect to ground.

The voltage on the cathode of the diode 206 is introduced to a series relationship formed by the resistance 36, a potentiometer 210 and the resistance 28. The movable arm of the potentiometer 210 is connected to one input terminal of the operational amplifier 52. The other input of the amplifier 52 is connected to ground reference potential through the resistor 232. The output from the operational amplifier 52 is introduced to one terminal of the comparator 54, the other terminal of which is common with the reference potential such as ground.

As will be seen, the potentiometer 210 is included in the circuitry of FIG. 6 but is not shown in the simplified circuitry of FIG. 1. The movable arm of the potentiometer 210 is adjustable to provide for the introduction of a predetermined amount of power such as one (1) milliwatt to the detector 20 in FIG. 1 when the data processing unit programs a predetermined power datum into the converter 26.

In addition to being introduced to one of the input terminals of the comparator 54, the output from the operational amplifier 52 is introduced to first terminals of field effect transistor switches 220 and 222. The second terminal of the field effect transistor switch 222 is connected to the second input terminal of the operational amplifier 52 through a capacitance 224 and a resistance 226 in series. The second terminal of the field effect transistor switch 222 is connected to the anode of a diode 228 and the cathode of a diode 230. The cathode of the diode 228 and the anode of the diode 230 are common with the second input terminal of the operational amplifier 52. The cathode of the diode 228 and the anode of the diode 230 are also connected through a resistance 232 to the reference potential such as the ground 12. The operation of the field effect transistor switch 220 is controlled by a logic translator 234 and the operation of the switch 222 is controlled by a logic translator 236. The logic translators 234 and 236 respectively receive signals from lines 238 and 240.

A signal is produced on the line 238 when the oscillator 10 is to be turned off. This signal causes the switch 220 to become closed and the switch 222 to remain open. A signal is produced on the line 240 when the oscillator 10 is to operate to produce alternating signals. This causes the switch 222 to become closed and the switch 220 to become open. When the oscillator 10 is conductive, a control voltage passes from the amplifier 52 through the shaping network (op-amps and transistors generally indicated at 248) to a control PIN diode 250. This diode serves to regulate the amplitude of the RF oscillator to a level determined by the voltage programmed into the converter 26 in FIG. 1 by the data processing unit 24. Alternatively, the oscillator current can be varied to control the amplitude of its oscillations.

When the oscillator is operative, the comparator 54 is not used and the resistor 226 and the capacitor 224 are operative to stabilize the amplifier 52. When the oscillator is not producing signals, the operational amplifier 52 and the comparator 54 are used to determine the quiescent voltage of the bridge 32 connected to the output of the diode 206. The data processing unit 24 performs this calculation by outputting a series of trial voltages from the converter 26 until an equality of the voltage on the anode of the diode 206 and the output of the converter 26 is achieved. The data processing unit 24 utilizes the output of the comparator 54 to achieve this by employing an algorithmic technique such as that of successive approximations. During this operation, the diodes 228 and 230 are connected in the circuit to ensure that the amplifier 52 does not saturate.

The apparatus described above allows the data processing unit 24 to supply the detector 20 with precise amounts of RF power. This power is varied over a large range such as 50 dB and the data processing unit records the voltage response of the detector 20 for a series of these precisely known powers. For example, the response of the detector may be recorded from −30 dBm to +20 dBm in 1 dB steps. The data processing unit 24 stores the response of the detector 20 in a non-volatile random access memory. The detector may then be removed from the calibrator apparatus and connected to any other source of RF power over an extremely wide frequency range (such as 10 MHz to 40 GHz). The data processing unit 24 then uses the data recorded in the non-volatile random access memory to precisely determine the power incident on the detector 20.

The system shown in the drawings and described above has certain important advantages. It provides an indication of the power from a signal source such as the oscillator 10 with speed, accuracy and signal level range significantly greater than the systems of the prior art. For example, it provides indications of power with an error less than one percent (1%). This is in comparison to errors as high as three percent (3%) to four percent (4%) provided by the systems of the prior art. The system of this invention also provides such indications of power through a range of frequencies between approximately ten (10) megahertz and forty (40) gigahertz. The system of this invention further provides such indications of power through a range of attenuation as high as fifty decibels (50 db).

Although this application has been disclosed and illustrated with reference to particular embodiments, the principles involved are susceptible of numerous other embodiments which will be apparent to persons skilled in the art. The invention is, therefore, to be limited only as indicated by the scope of the appended claims.

We claim:

1. A system for use with an alternating voltage and with a detector calibrating the alternating voltage comprising:
   means for producing a reference voltage representative of the magnitutde of the alternating voltage,
   means for introducing the alternating voltage to the detector to provide for the production from the detector of a voltage representative of the alternating voltage,
   means for providing a reference potential,
   means responsive to the voltage from the detector for producing a second voltage representative of the voltage from the detector,
   means responsive to the combination of the reference and the second voltage and to the reference potential for producing an error signal, and
   means responsive to the error signal for adjusting the magnitude of the alternating voltage to minimize the magnitude of the error signal.

2. A system as set forth in claim 1, wherein the reference voltage means includes a thermistor.

3. A system as set forth in claim 1 further comprising:
   means for providing different ranges of attenuation of the alternating voltage, and
   adjusting means being responsive to the voltage from the detector for adjusting the amplitude of the alternating voltage for the different ranges of attenuation to produce an equality between the voltage from the detector for a maximum value of the alternating voltage for a particular one of the attenuator ranges and the voltage from the detector for the next one of the attenuator ranges for the same value of the alternating voltage.

4. A system as set forth in claim 3,
   wherein the reference voltage means includes a bridge circuit having a plurality of impedance and one of the impedances in the bridge circuit is a variable impedance and the variable impedance changes characteristics with changes in temperature to co-operate with the other impedances in the bridge circuit to balance the bridge circuit.

5. A system for calibrating a detector to measure power comprising:
   means for providing an alternating signal,
   means for providing an impedance,
   means responsive to the alternating signal for regulating the impedance to a particular value even with changes in the amplitude and frequency of the alternating signal, means including the regulated impedance for producing a reference voltage in response to the alternating signal, means responsive to the alternating signal and operatively coupled to the detector for producing a second voltage, means for providing a reference potential, means for comparing the combination of the reference and second voltages with the reference potential to produce an error signal, and means responsive to the error signal for adjusting the amplitude of the alternating signal to minimize the error signal.

6. A system as set forth in claim 5, wherein the impedance-regulating means includes means for producing changes in the impedance in accordance with changes in temperature.

7. A system as set forth in claim 6, wherein the impedance-regulating means includes a bridge and the regulated impedance is included in the bridge.

8. A system as set forth in claim 7 further comprising:

attenuator means associated with the alternating signal means and the detector means to extend the range detected by the detector means of the amplitudes of the alternating signal from the alternating signal means.

9. A system as set forth in claim 5 further comprising;

attenuator means provided with a plurality of ranges and associated with the alternating signal means and the detector to extend the range of the amplitudes of the alternating signal detected by the detector, and data processing means responsive to the signal from the detector for calibrating the detector to provide a correspondance in indication from the detector for the maximum value of the alternating signal from each one of the attenuator ranges and the minimum value of the alternating signal from the next one of the attenuator ranges.

10. A system as set forth in claim 7 further comprising:

data processing means operative on the alternating signal to adjust the output from the detector to calibrate the detection by the detector for a maximum value in each attenuating range and a value in the next attenuating range corresponding to such maximum value.

11. A system for calibrating a detector further comprising:

means for providing a reference potential, means for providing an alternating signal, a bridge circuit including a plurality of impedances, a particular one of the impedances in the plurality having a value variable with changes in its temperature to maintain a substantially constant impedance value in the bridge, means for introducing the alternating voltage to the bridge circuit to obtain from the bridge circuit a reference voltage related to the amplitude of the alternating voltage, means for introducing the alternating signal to the detector to obtain a voltage from the detector, data processing means responsive to the voltage from the detector for producing a voltage having an amplitude related to the amplitude of the voltage from the detector, means for comparing the combination of the reference voltage and the voltage from the data processing means with the reference potential to obtain an error signal, and means for introducing the error signal to the alternating signal means to obtain an adjustment in the amplitude of the alternating signal in a direction to minimize the error signal.

12. A system as set forth in claim 11 further comprising:

means for attenuating the alternating signal through different ranges of attenuation before introduction of the alternating signal to the detector.

13. A system as set forth in claim 12 further comprising:

means connected between the detector and the data processing means to convert the voltage from the detector into a digital signal for introduction to the data processing means and wherein means connected between the data processing means and the error signal means to convert the digital signal from the data processing means into an analog signal for introduction to the error signal means.

14. A system as set forth in claim 13, wherein the error signal means includes an operational amplifier and wherein the alternating signal has a fundamental frequency and harmonic frequencies and wherein means are responsive to the alternating signal for passing only the fundamental frequency of the alternating signal to the detector.

15. A system for calibrating the operation of a detector comprising:

means for providing an alternating signal, means responsive to the amplitude of the alternating signal for providing an impedance having a regulated value regardless of changes in the amplitude of the alternating signal, means including the last mentioned means for detecting the amplitude of the alternating signal to produce a reference voltage, means response to the alternating signal for introducing the alternating signal to the detector, means operatively coupled to the detector for producing a second voltage representative of the alternating signal, means for providing a reference potential and means responsive to the combination of the reference voltage and the second voltage and to the reference potential for adjusting the amplitude of the alternating signal, in accordance with any differences between the reference potential and the combination of the reference voltage and the second voltage, in a direction to minimize any such differences.

16. A system as set forth in claim 15 further comprising:

means for providing different ranges of attenuation, means for providing for the selection of an individual one of the different ranges of attenuation, data processing means, and means responsive to the different ranges of attenuation for obtaining an operation of the data processing means in the different ranges of attenuation to provide for a calibration by the data processing means between the maximum amplitude detected by the detector for attenuations in individual ones of the different ranges of attenuation and the amplitude detected by the detector in the next one of the different ranges of attenuation for an amplitude corresponding to such maximum amplitude.

17. A system as set forth in claim 15, wherein
the means for producing the second voltate includes data processing means, and
means responsive to the amplitude detected by the detector for providing a look-up table in the data processing means to indicate the power provided by the alternating signal.

18. A system for calibrating a voltage from a detector comprising:
means for converting the voltage from the detector into digital signals,
data processing means responsive to the digital signals for producing a digital output representative of the digital signals,
means responsive to the output from the data processing means for converting this output into a analog voltage,
means for providing a reference potential,
means for comparing the reference potential and the analog voltage to produce an error signal, and
means for introducing the error signal to the data processing means to change the voltage from the data processing means in a direction to minimize the error signal.

19. A system as set forth in claim 18, wherein
the analog voltage means includes a digital-to-analog converter.

20. A system for calibrating a voltage from a detector comprising:
means for converting the voltage into digital signals representative of voltage,
data processing means for processing the digital signals to provide an output dependent upon such processing,
means for converting the output from the data processing means into an analog voltage,
means including a bridge circuit for providing a reference voltage,
means for combining the analog voltage from the converting means and the reference voltage to produce a control voltage,
means for providing a reference potential,
means responsive to the control voltage and the reference potential to produce an error signal, and
means for introducing the error signal to the data processing means to obtain an adjustment of the data processing means in a direction for eliminating the error signal.

21. A system as set forth in claim 20, wherein
the bridge circuit includes a variable impedance and the bridge cirucit is balanced when the variable impedance has a particular value.

22. A system for calibrating a voltage from a detector comprising:
means for providing a first reference potential,
means including a bridge for providing a direct voltage,
data processing means for producing a digital output,
means responsive to the digital output for converting the digital output into an analog voltage,
means responsive to the first reference potential and the combination of the direct voltage and the analog voltage to produce an error signal,
means for providing a second reference potential,
means for comparing the second reference potential and the error signal for producing a control signal, and
means for introducing the control signal to the data processing means to adjust the digital output in a direction for minimizing the control signal.

23. A system as set forth in claim 22, wherein
the bridge circuit includes a variable impednace and the bridge circuit is balanced when the variable impedance has a particular value.

* * * * *